United States Patent [19]

Paparo et al.

[11] Patent Number: 5,449,936
[45] Date of Patent: Sep. 12, 1995

[54] HIGH CURRENT MOS TRANSISTOR BRIDGE STRUCTURE

[75] Inventors: Mario Paparo, San Giovanni La Punta; Natale Aiello, Catania, both of Italy

[73] Assignees: SGS-Thompson Microelectronics srl; Consorzio Per La Ricerca Sulla Microelectronics Nel Mezzogiorno, both of Italy

[21] Appl. No.: 310,214

[22] Filed: Sep. 21, 1994

Related U.S. Application Data

[63] Continuation of Ser. No. 979,211, Nov. 20, 1992, abandoned.

[30] Foreign Application Priority Data

Nov. 25, 1991 [EP] European Pat. Off. ........... 91830512

[51] Int. Cl.$^6$ .............................................. H01L 29/10
[52] U.S. Cl. .................................. 257/337; 257/338; 257/343
[58] Field of Search .............. 257/337, 338, 341, 343, 257/328, 335, 342

[56] References Cited

U.S. PATENT DOCUMENTS

| | | | |
|---|---|---|---|
| 4,535,203 | 8/1985 | Jenkins et al. | 379/333 |
| 4,823,065 | 4/1989 | Gousset | 318/798 |
| 4,866,556 | 9/1989 | Hebenstreit | 361/91 |
| 4,949,142 | 8/1990 | Contiero et al. | |
| 5,045,900 | 9/1991 | Tamagawa | |
| 5,053,838 | 10/1991 | Fujihira et al. | 257/342 |

FOREIGN PATENT DOCUMENTS

| | | | |
|---|---|---|---|
| 60-124863 | 7/1985 | Japan. | |
| 60-249366 | 12/1985 | Japan | 257/343 |
| 2-210862 | 8/1990 | Japan | 257/335 |
| 3-180061 | 8/1991 | Japan | 257/338 |

OTHER PUBLICATIONS

Technical Digest, International Electron Devices Meeting 1987 Washington, D.C., pp. 766–769.

Primary Examiner—Sara W. Crane
Assistant Examiner—Courtney A. Bowers
Attorney, Agent, or Firm—Felsman, Bradley, Gunter & Dillon

[57] ABSTRACT

A high current MOS transistor integrated bridge structure includes at least two arms, each having a first and a second MOS transistor. The structure is formed on an N++ substrate forming a positive potential output terminal, and an N-type epitaxial layer. For each first transistor, an L shaped region is formed of a horizontal N+ region which is connected to the surface through an N++ vertical region. Forming a corresponding alternating current input with this region is an N type region which has within it a succession of P type regions, and a pair of N+ type regions forming a negative potential output terminal. For each second transistor, an N+ region has N++ lateral regions extending to the surface, and includes an N type region containing a succession of P type regions and a pair of N+ regions forming corresponding alternating current inputs. The first transistor of each arm is entirely contained within a P type isolation region which has P+ regions extending to the surface of the substrate.

7 Claims, 4 Drawing Sheets

HIGH CURRENT MOS TRANSISTOR BRIDGE STRUCTURE

This is a continuation, of application Ser. No. 07/979,211, filed Nov. 20, 1992, now abandoned.

BACKGROUND OF THE INVENTION

1. Field of the Invention

The present invention relates to a high current MOS transistor integrated bridge structure which optimizes conduction power losses.

2. Description of the Prior Art

A Graetz bridge rectifier circuit is often used to convert an electrical signal from alternating current to direct current. This rectifier circuit consists of two arms, or half-bridges, each containing two transistors in series.

A known type of rectifier circuit using integrated MOS technology is described U.S. Pat. No. 4,949,142.

This circuit provides a pair of MOS transistors on each arm of the bridge. These transistors are coupled together so that the source electrode of a first transistor in each arm is connected to the drain electrode of the second transistor in the arm. Coupling diodes are also placed between the source and drain electrodes of each transistor.

When this prior art circuit is constructed in integrated form, the coupled semiconductor regions, the transistor source and drain, the diodes, and the gate electrodes are fabricated on a single semiconductor substrate. This minimizes the substrate area used, and produces a higher speed circuit. A circuit constructed in this manner does optimize the area used on the semiconductor substrate, and ensures satisfactory circuit speed. However, this type of circuit cannot be fabricated so as to exhibit reasonable operating efficiency. The resulting monolithic integrated circuit has parasitic transistors which cause considerable power losses. While the circuit is operating, high current flow occurs, which causes excessive power dissipation through the parasitic devices and at connections between devices. This can result in breakdown of the connections, the parasitic transistors themselves, and adjacent integrated components forming the bridge. As a result, the bridge circuit fails to function.

SUMMARY OF THE INVENTION

An object of the present invention is to provide a high current MOS transistor integrated bridge structure which optimizes conduction power losses, and which can be constructed as a monolithic device on a single silicon substrate.

Therefore, according to the present invention, a high current MOS transistor integrated bridge structure includes at least two arms, each having a first and a second MOS transistor. The structure is formed on an N++ substrate forming a positive potential output terminal, and an N-type epitaxial layer. For each first transistor, an L shaped region is formed of a horizontal N+ region which is connected to the surface through an N++ vertical region. Forming a corresponding alternating current input with this region is an N type region which has within it a succession of P type regions, and a pair of N+ type regions forming a negative potential output terminal. For each second transistor, an N+ region has N++ lateral regions extending to the surface, and includes an N type region containing a succession of P type regions and a pair of N+ regions forming corresponding alternating current inputs. The first transistor of each arm is entirely contained within a P type isolation region which has P+ regions extending to the surface of the substrate.

BRIEF DESCRIPTION OF THE DRAWINGS

The features of this invention will be more apparent from a practical embodiment illustrated by way of a non-restrictive example in the appended drawing, in which.

DESCRIPTION OF THE PREFERRED EMBODIMENT

In an integrated bridge structure according to the present invention, the first transistor of each arm of an integrated bridge structure is formed entirely within a P type isolation region, which includes P+ regions extending to the surface of the substrate. The presence of the P type isolation regions causes the effect of parasitic transistors, formed between the first and second transistors of the first and second arms of the bridge, to be cancelled out. This cancelling results from the nature of the integrated monolithic construction described below.

In particular, there is a reduction in dissipated power with the described device. In addition to the cancelling of parasitic transistors, this is due in part to the fact that this structure has a vertical current flow in its central portion. The higher potential node of the rectified voltage can be tapped directly on the substrate of the device.

Figure 1:
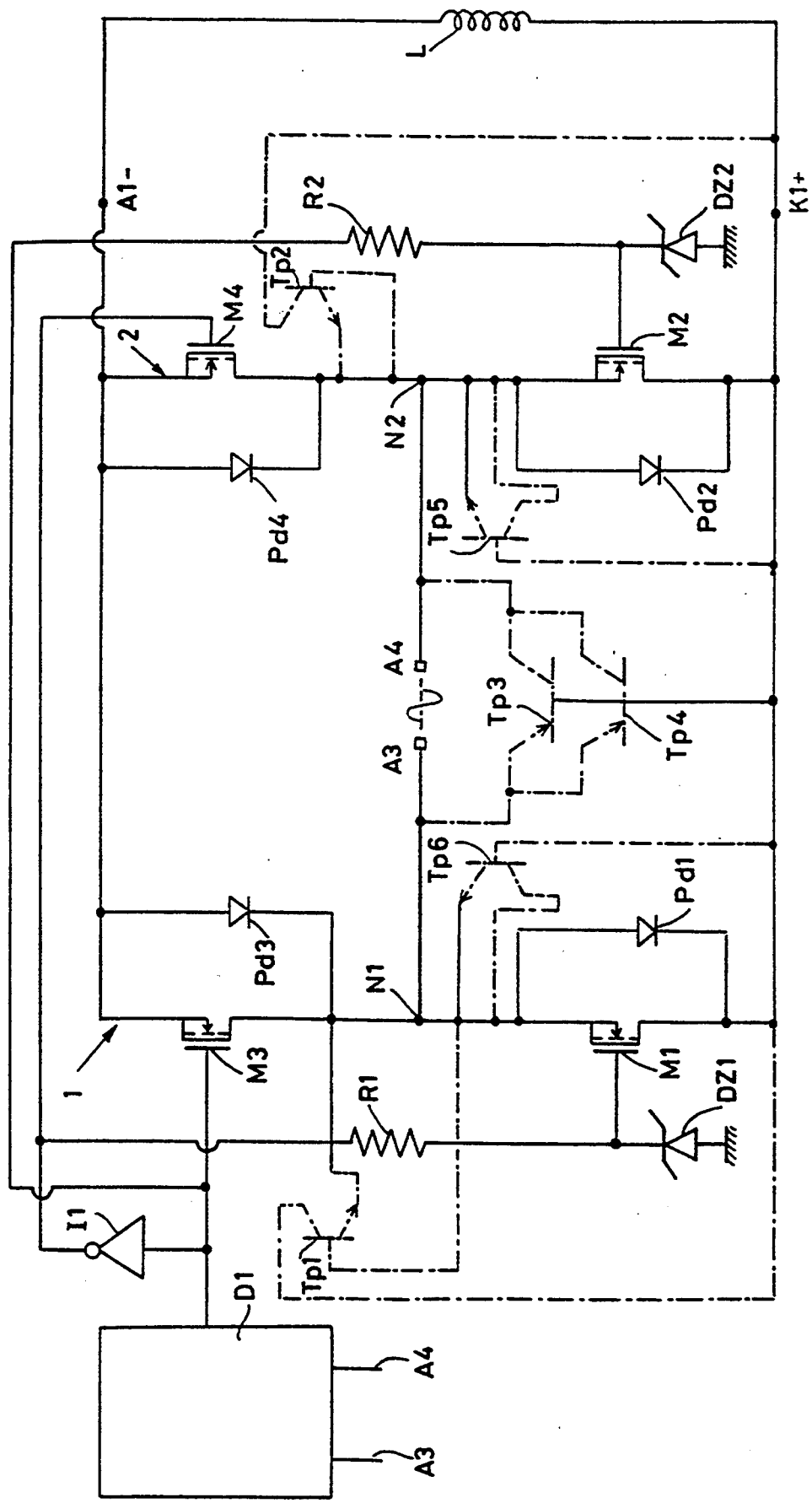
FIG. 1 shows a first circuit diagram of a bridge rectifier according to the invention.

Referring to FIG. 1, a Graetz bridge rectifier circuit is shown. This circuit includes two arms, or half bridges, 1, 2. Arm 1 includes first and second transistors M3 and M1, and arm 2 includes first and second transistors M4 and M2. All four transistors M1, M2, M3, and M4 are N channel MOS transistors.

The sources of transistors M3, M4, are connected together, into a negative potential output terminal A1. The gates receive an output signal directly and via an inverter I1, respectively, from a drive device D1. Drive device D1 in turn receives a signal which is present at alternating inputs A3, A4. The drains of transistors M3, M4, are connected to the sources of transistors M1, M2, respectively, at circuit nodes N1, N2. The drains of transistors M1, M2, are connected to positive potential output K1, and their gates are grounded through zener diodes DZ1, DZ2. The gates also receive the output signal from drive device D1 through inverter I1, and directly, respectively.

Intrinsic resistances R1, R2, of the integrated structure are placed between the gate of transistor M1 and the output of inverter I1, and between the gate of transistor M2, and the output of drive device D1, respectively. A load L is connected between an output terminal A1 at a negative potential, and output K1 at a positive potential.

Figure 2:
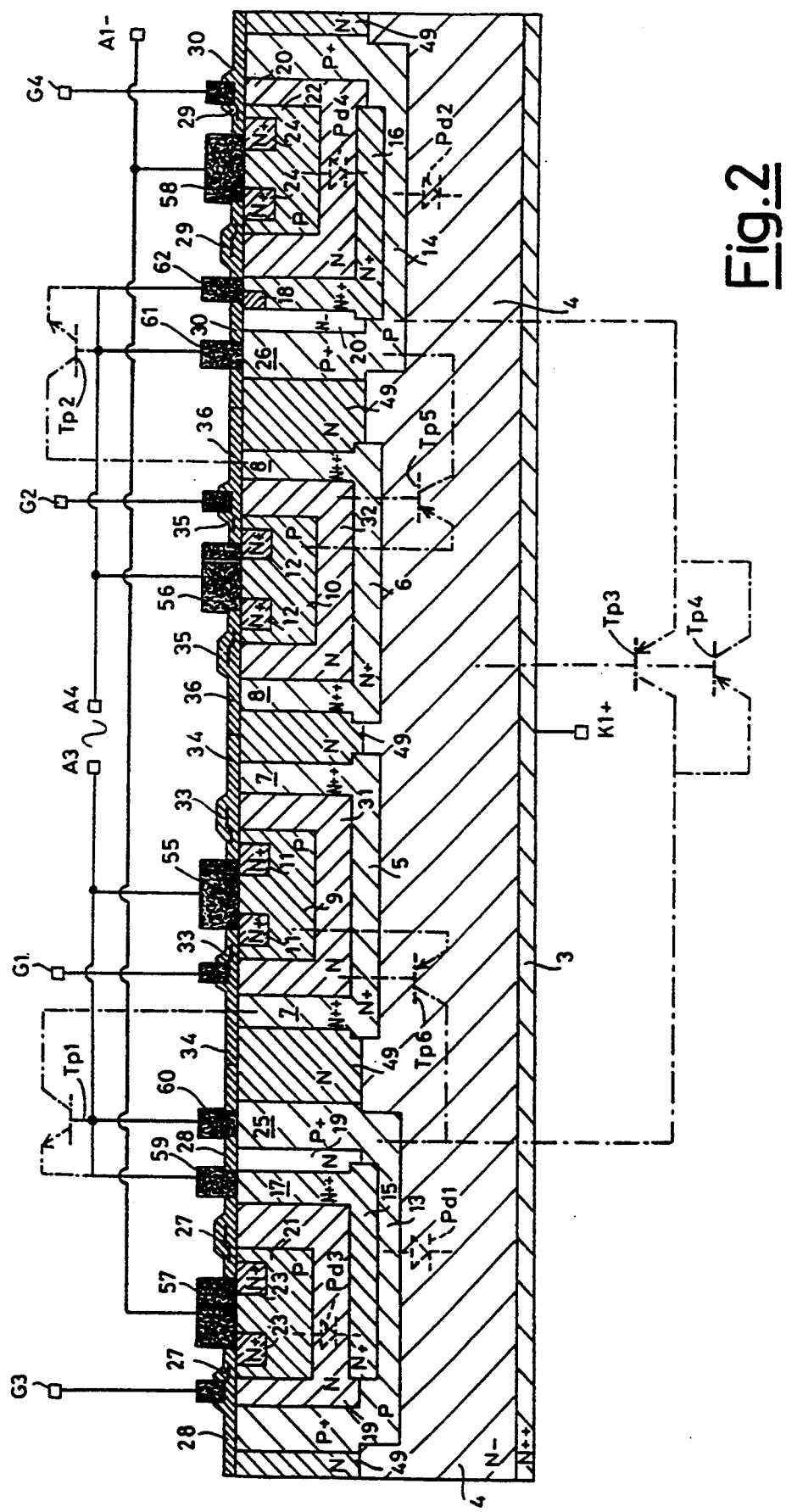
FIG. 2 shows an integrated embodiment according to the invention of a bridge rectifier with an equivalent circuit to that illustrated in FIG. 1.

A monolithic embodiment of the bridge circuit described above is illustrated in FIG. 2. This circuit includes an N++ substrate 3 which forms positive potential output terminal K1. N type epitaxial layer 4 overlays the substrate layer 3. Various regions forming transistors M1, M2, M3, and M4 are formed within epitaxial layer 4.

Transistors M1 and M2 are formed directly in the epitaxial layer. Transistors M3 and M4 are fabricated in P type pockets 13, 14 respectively, which are directly contained in epitaxial layer 4. The P type pockets 13, 14, extend to the surface with P+ regions 25, 26 contained in epitaxial layer 49. The function of these pockets will be explained below.

Transistor M3 is formed with an enriched N+ drain region 15. Region 15 forms an L shape with N++ region 17 which extends to the surface. Region 15, together with region 17, bounds on its two sides an N type drain region 19. Region 19 contains a P type body region 21, which in turn contains N+ source regions 23.

The gate of transistor M3 is formed from a pair of regions 27 embedded in a surface insulating layer 28. The gate electrode is indicated by G3. Regions 21, and 15 and 19 represent respectively the anode and cathode of a parasitic diode Pd3 formed in parallel between the source and drain of transistor M3.

Transistor M4 is formed from an N+ enriched drain region 16. Region 16 also has an L shape with a lateral N++ region 18 extending to the surface. Region together with region 18, bounds on its two sides an N type drain region 20. Region 20 contains a P type body region 22, which in turn contains N+ source regions 24.

The gate of M4 is formed by a pair of regions 29 embedded in a surface insulating layer 30. The gate electrode is indicated by G4. Regions 22, and 16 and 20, represent respectively the anode and cathode of a parasitic diode Pd4 formed in parallel with transistor M4.

Transistor M1 is formed from an enriched N+ drain region 5 having lateral regions 7 which extend to the surface. Region 5, together with regions 7, contains an N type drain region 31. Within region 31, there is contained a P type body region 9, which in turn contains N+ source regions 11. The gate of M1 is formed from a pair of regions 33 embedded in a surface insulating layer 34. The gate electrode is indicated by G1. Regions 13 and 4 represent respectively the anode and cathode of a parasitic diode Pd1 formed in parallel with transistor M1.

Transistor M2 is formed from an enriched N+ drain region 6 having lateral regions 8 which extend to the surface. Region 6, together with regions 8, contains an N type drain region 32. Within region 32 is formed a P type body region 10, which in turn contains N+ source regions 12. The gate of M2 is formed from a pair of regions 35 embedded in a surface insulating layer 36. The gate electrode is indicated by G2. Regions 14 and 4 represent respectively the anode and cathode of a parasitic diode Pd2 placed in parallel with transistor M2.

Metal strips 55, 56, 58, 59, 60, 61, and 69 are formed on the surface of the device. The metal strips connect regions 9, 11, 17, and 25 to input A3, and regions 10, 12 61, and 62 to input A4. Additionally regions 21, 22, 23, 24, are all connected to negative potential output terminal A1.

Parasitic transistors Tp1, Tp2, Tp3, Tp4, Tp5, and Tp6, are formed within the integrated monolithic structure. These parasitic transistors are indicated by dashed lines in the drawing. In the absence of regions 13, 14, 25, and 26, or in a structure in which all four MOS transistors are formed directly in a grounded substrate, such as in the United States patent mentioned in the introduction, these parasitic transistors are active. The action of these parasitic transistors results in the consequent loss of power in the structure during operation.

Parasitic transistor Tp1 has a base coinciding with region 25, an emitter with region 17, and a collector with region 7. In circuit terms, as can be seen in FIG. 1, the emitter and the base of transistor Tp1 are connected to the input A3. The collector is connected to positive potential output terminal K1.

Parasitic transistor Tp2 has a base coinciding with region 26, an emitter with region 18, and a collector with region 6. In circuit terms, the emitter and base of Tp2 are connected to input A4. The collector of Tp2 is connected to positive potential output terminal K1.

Parasitic transistor Tp3 has a base coinciding with epitaxial layer 4, an emitter with region 14, and a collector with region 13. In circuit terms, the emitter and collector of transistor Tp3 are connected to inputs A4 and A3, respectively. The base is connected to positive potential terminal K1.

Parasitic transistor Tp4 has a base formed by epitaxial layer 4, and an emitter formed by region 13. The collector of Tp4 is formed by region 14. In circuit terms, the emitter and collector of transistor Tp4 are connected to inputs A3 and A4, respectively. The base of Tp4 is connected to positive potential terminal K1.

Parasitic transistor Tp5 has a base formed by regions 32, 6, and 8. The emitter is formed by region 10, and the collector by regions 14 and 26. In circuit terms, the base of transistor Tp5 is connected to positive potential terminal K1. The emitter and collector of Tp5 are connected to input A4.

Parasitic transistor Tp6 has a base formed by regions 5, 7, and 31. The emitter is formed by region 9, and the collector regions 13, 25. In circuit terms, the base of transistor Tp6 is connected to positive terminal K1. The emitter and collector are connected to input A3.

In the central zone of the structure described above, the device is a vertical current flow device. This has the advantage that it can tap the higher potential node of the rectified voltage directly on substrate 3, instead of at the surface of the device. This improves the power handling capacity of the device.

As a result of the presence of regions 13, 14, 25, and 26, which are not grounded, but rather are connected to inputs A3 and A4, parasitic transistors Tp1 and Tp1 are switched off. This occurs because the base emitter junctions of transistors Tp1 and Tp2 are short-circuited. Additionally, parasitic transistors Tp5 and Tp6 are inactive because their emitter and collector regions are short circuited together. As far as parasitic transistors Tp3 and Tp4 are concerned, current losses due to their operations are negligible. This occurs because these are lateral PNP transistors having a very wide base, and therefore an extremely low gain.

With reference to parasitic diodes Pd1, Pd2, Pd3, and Pd4, when the potential on input A3 is positive transistors M1 and M4 conduct. Diodes Pd1 and Pd4 make no contribution inasmuch as they are short-circuited by transistors M1 and M4. Diodes Pd3 and Pd4 are reverse biased. A similar situation arises in the case of a negative potential on input A3. In this case, Pd2 and Pd3 are short-circuited by transistors M2 and M3, which are conducting and to which Pd2 and Pd3 are in parallel. In this situation, diodes Pd1 and Pd4 are reversed biased.

The drive circuit for gates G1, G2 uses suitable charge pumping techniques to drive gates into M1 and M2. As is known in the art, M1 and M2 require a greater potential than the positive potential available on the substrate, which coincides with positive potential output terminal K1. This greater potential must have a value equal to at least the voltage required to make the MOS transistors fully conducting.

Figure 3:
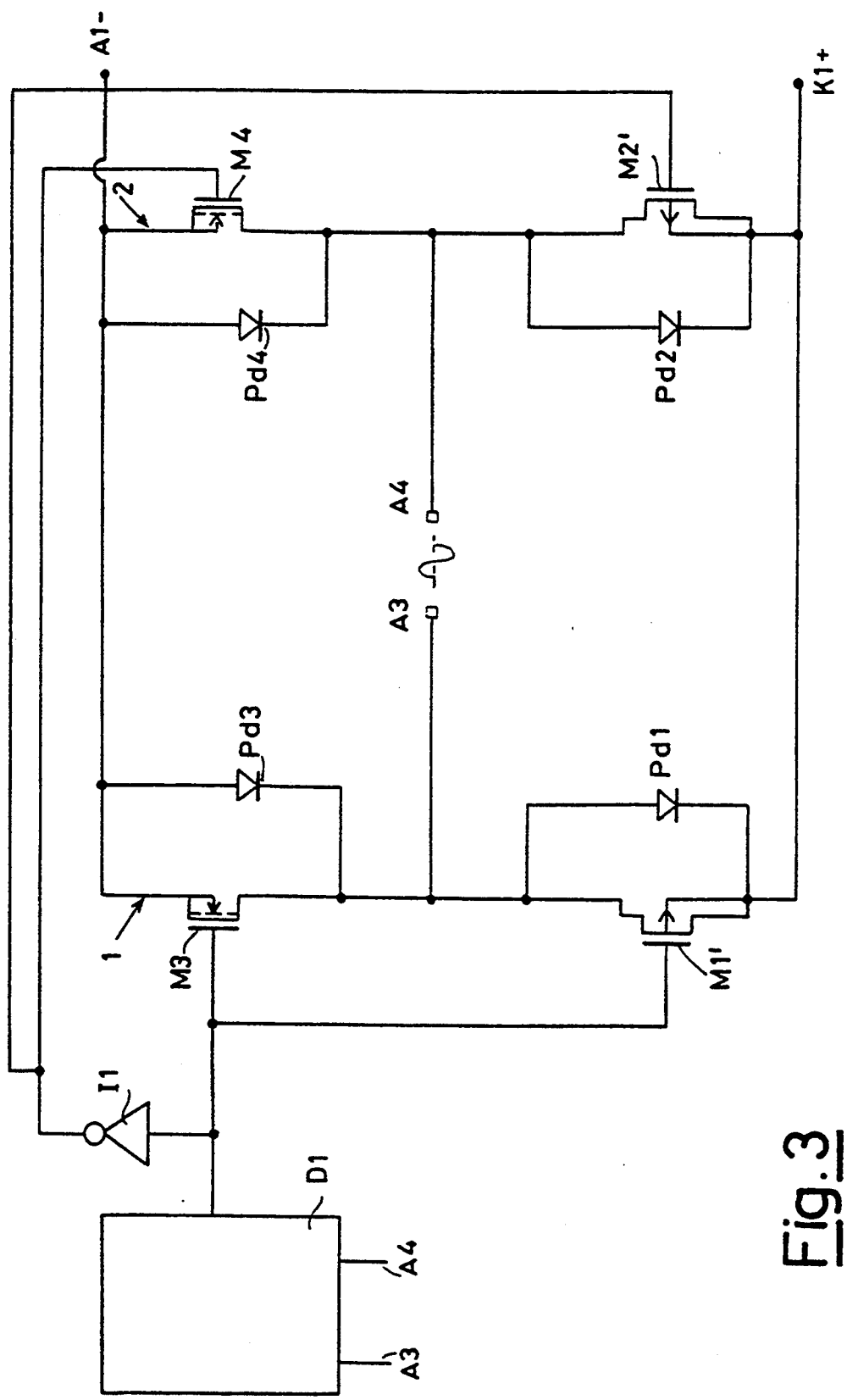
FIG. 3 shows an alternative circuit diagram to that shown in FIG. 1.

An alternative structure to that described above is illustrated in FIGS. 3 and 4. FIG. 3 differs from FIG. 1 by the presence of P-channel MOS transistors M1', M2', instead of N-channel transistors M1, M2.

Figure 4:
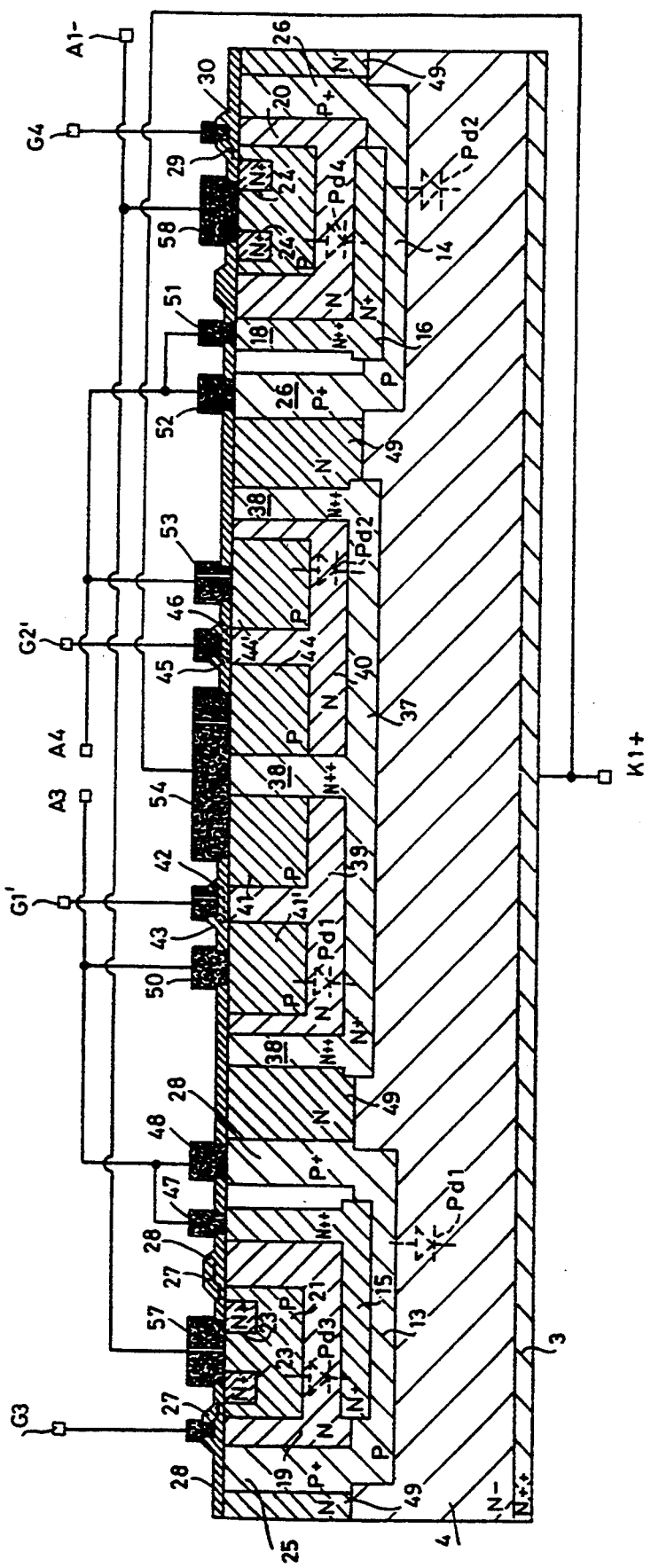
FIG. 4 shows an integrated embodiment of the circuit diagram illustrated in FIG. 3.

As illustrated in FIG. 4, transistors M1', M2', are constructed within epitaxial layers 4, 49. They include an N+ drain region 37 with N++ regions 38 which extend to the surface. Contained within region 37 are N type body regions 39, 40. Region 39 is for transistor M1', and region 40 is for transistor M2'.

Transistor M1' also includes a P type source region 41 and drain 41' within body region 39. The gate of M1' is formed by a region 42 embedded in a surface insulating layer 43. The gate electrode is indicated by G1'.

Transistor M2 also includes a P type source region 44 and drain 44' within body region 40. The gate of M2' is formed by a region 45 embedded in a surface insulating layer 46. The gate electrode is indicated by G2'.

Metal strips 47, 48, 50, are formed on the surface of the structure and connect regions 13, 15, and 41' to input A3. Metal strips 51, 52, 53, connect regions 14, 16, 44' to input A4. Strip 54 connects regions 37, 41, 44 to positive potential output terminal K1. Metal strips 57, 58 connect regions 23, 24, to output terminal A1.

Examination of FIG. 3 will reveal the extreme simplicity of the bridge drive circuit in this second version because the driving voltages for transistor gates M1', M2', M3, and M4 always lie between the more positive potential present on output terminal K1 and the more negative potential present on output terminal A1. This results in an obvious advantage for driving circuit D1.

In the case of both the circuit of FIG. 1 and that of FIG. 3, it is possible to construct the corresponding drive circuits in monolithic form on the same substrate which holds the bridge structure. This results in the formation of a self-supplied synchronous converter.

The structures formed in accordance with the present invention can be used in multi-phase circuits in all structural configurations, and the number of bridge arms can vary from a minimum of one to N. All the dimensions of the substrate used are linked to the maximum power handling capacity of the device, and the total number of integratable circuit arms. The structure to which this invention relates may also be used with a voltage generator (VA3-VA4) and load L swapped. This configuration produces bridges with N arms for applications in motor control and static inverters.

Given the form of the structure, the limitation on the feed voltage for the bridge is imposed by the vertical current flow MOS and isolated drain devices (typically 60-200 volts), while the top arms of the bridge (vertical current flow MOS transistors) can have very much higher breakdown voltages (around 2000 volts). It is possible to replace the two MOS transistors M3, M4, having vertical current flow and isolated drain with a configuration of MOS transistors having a vertical current flow and isolated drain connected together in series. With this configuration, it is possible to increase the maximum operating voltage of the bridge to a value equal to N times the breakdown voltage of the transistors, where N is the number of transistors placed in series; with each other.

If desired, the described device may also include one or more insulating pockets 13, 14, 25, and 26 connected to a potential which is not greater than the substrate potential. In these pockets one or more components of the control and driving devices for the two arms of the bridge can be fabricated.

While the invention has been particularly shown and described with reference to a preferred embodiment, it will be understood by those skilled in the art that various changes in form and detail may be made therein without departing from the spirit and scope of the invention.

What is claimed is:

1. A MOS transistor high current integrated bridge structure having at least a first and a second bridge branches, each having a first, N-channel, MOS transistor and a second MOS transistor which are serially connected to each other between positive and negative output bridge terminals and have a common node connected to a respective alternating current input terminal, the structure comprising:

an N-type substrate having a bottom surface connected to the positive output bridge terminal;

an N-type epitaxial layer formed over the substrate and having a top surface;

at least a first and a second U-shaped P-type isolation regions extending from the epitaxial layer top surface, each completely surrounding doped source regions, electrically coupled to the negative output bridge terminal, and doped drain regions, electrically coupled to the respective alternating current input terminal, of the respective first N-channel MOS transistors of the first and second bridge branches, each U-shaped P-type isolation region being electrically coupled to said respective alternating current input terminal;

at least a third and a fourth U-shaped N-type regions, extending into the epitaxial layer from the upper surface thereof, outside the U-shaped P-type isolation regions, each completely surrounding doped source regions of a respective second MOS transistor of the first and second bridge branches, respectively, wherein the second transistors provide vertical current flow between the epitaxial layer top surface and the substrate bottom surface.

2. A structure according to claim 1 wherein said second transistors of said first and second bridge branches are P channel MOS transistors.

3. A structure according to claim 1, wherein said at least first and second bridge branches comprises a plurality of branches forming a multiphase circuit.

4. A structure according to claim 1, further comprising at least one further isolation region connected to a potential which is not higher than the potential of the substrate to isolate at least one component of a driving and control device for the branches of the bridge.

5. The structure of claim 2, wherein the third and fourth N-type regions are adjacent to P-type drain regions formed within the epitaxial layer, wherein current is allowed to flow from the drain region to the substrate bottom surface through the third and fourth U-shaped regions.

6. The structure of claim 1, wherein the third and fourth U-shaped regions form drain regions of N-Channel MOS transistors.

7. A MOS transistor high current integrated bridge structure having at least one first and one second bridge branches, each having a first, N-channel, MOS transistor and a second MOS transistor which are serially connected to each other between a positive and a negative output bridge terminals and have a common node connected to a respective alternating current input terminal, the structure comprising:
- an N-type substrate having a bottom surface connected to the positive output bridge terminal;
- an N-type epitaxial layer formed over the substrate and having a top surface;
- at least one first and one second U-shaped P-type isolation regions, extending from the epitaxial layer top surface therein, each completely surrounding doped source regions, electrically coupled to the negative output bridge terminal, and doped drain regions, electrically coupled to the respective alternating current input terminal, of a respective first, N-channel MOS transistors of the first and second bridge branches, each U-shaped P-type isolation region being electrically coupled to said respective alternating current input terminal;
- at least one third and one fourth U-shaped N-type regions, extending into the epitaxial layer from the upper surface thereof, outside the U-shaped P-type isolation regions, each completely surrounding doped source regions and drain regions of a respective second MOS transistors of the first and second bridge branches;
- wherein said first and second U-shaped P-type isolation regions are separated by a region of the epitaxial layer in which the third and fourth U-shaped N-type regions are formed.

* * * * *

UNITED STATES PATENT AND TRADEMARK OFFICE
CERTIFICATE OF CORRECTION

PATENT NO. : 5,449,936
DATED : September 12, 1995
INVENTOR(S) : Mario Paparo and Natale Aiello It is certified that error appears in the above-indentified patent and that said Letters Patent is hereby corrected as shown below:

ON THE TITLE PAGE:
Item [73] Assignee should read
-- STMicroelectronics, s.r.l.
Consorzio Per La Ricera Sulla Microelettronica Nel Mezzogiorno --.

Signed and Sealed this

Twenty-seventh Day of March, 2001

Attest:

NICHOLAS P. GODICI

Attesting Officer

Acting Director of the United States Patent and Trademark Office